(12) United States Patent
Porterfield

(10) Patent No.: US 6,515,483 B1
(45) Date of Patent: Feb. 4, 2003

(54) SYSTEM FOR PARTIAL SCAN TESTING OF INTEGRATED CIRCUITS

(75) Inventor: A. Kent Porterfield, New Brighton, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/651,456

(22) Filed: Aug. 30, 2000

(51) Int. Cl.[7] .............................................. G01R 31/28
(52) U.S. Cl. ..................... 324/529; 324/76.59; 714/724
(58) Field of Search ................................. 714/724, 726, 714/731; 324/765, 158.1, 529, 524, 76.59

(56) References Cited

U.S. PATENT DOCUMENTS

| | | | | |
|---|---|---|---|---|
| 4,602,210 A | * | 7/1986 | Fasang et al. | 714/731 |
| 5,392,297 A | * | 2/1995 | Bell et al. | 714/724 |
| 5,577,052 A | * | 11/1996 | Morris | 714/726 |
| 5,838,693 A | * | 11/1998 | Morley | 714/726 |
| 6,081,467 A | | 6/2000 | Waller | 365/201 |

* cited by examiner

Primary Examiner—N. Le
Assistant Examiner—Vincent Q. Nguyen
(74) Attorney, Agent, or Firm—Whyte Hirshboeck Dudek SC

(57) ABSTRACT

A method and system for partial scan testing of integrated circuits is disclosed. The invention includes determining at least one failed functional block during testing of the integrated circuit. The failed functional block is then logically isolated from the remaining non-failing functional blocks. Scan testing of the remainder of the non-failing functional blocks then occurs to determine the integrity of the remainder of the integrated circuit. The data coming out of the failing functional block is not allowed into the other functional blocks as input data. The invention allows the integrated circuit to be used and sold at a reduced functionality for applications not requiring the failed functional block(s).

2 Claims, 3 Drawing Sheets

SYSTEM FOR PARTIAL SCAN TESTING OF INTEGRATED CIRCUITS

BACKGROUND OF THE INVENTION

The present invention relates generally to the testing of integrated circuits. More particularly, the invention relates to scan testing of integrated circuits to determine failed functional blocks and partially scan testing the integrated circuit without the failed functional blocks such that the integrated circuit may be tested and sold at a reduced functionality.

Integrated circuitry on a chip is commonly tested. Scan testing is a common way to test integrated circuits by serially shifting test data into an integrated circuit, and then observing the output of the serial data. This method is very effective to determine whether an entire integrated circuit is functioning properly, and may be packaged and sold. The production chips of an integrated circuit to be sold are checked for manufacturing flaws before being furnished to a customer. Testing may also include applying a test program to the circuitry to determine if the logic on the chip responds as desired to various electrical inputs.

Due to processing improvements, it is possible to include an entire computer system on a chip. What was once a number of complex dedicated chips on a motherboard is now a number of complex blocks in an integrated circuit. The number of transistors in the integrated circuit may number in the tens of millions, or even more. The failure of a single transistor within one of these complex blocks will cause an integrated circuit to fail scan testing. As a result, the chip will be scrapped, resulting in a lower yield of usable chips, as well as higher production costs.

In scan testing, each flip-flop in a design to be tested has two input paths, one a functional path, and the other a test path. Each flip-flop in the integrated circuit (IC) is connected serially through the test path. That is, one flip-flop output is tied to the test input of another single flip-flop. A test program may include one or more scan patterns to be applied to the block of the circuit to be tested. First, data is scanned in through the serial test inputs to initialize all the flip-flops in the design. Then the functional input is used to capture data from the cone of logic in the parallel path. This loads each flip-flop with a new value, which is then shifted serially through the test input again. The process continues for many cycles, and serial data is shifted in through the test inputs, and then captured through the functional outputs. After running many cycles, test coverage increases as many different patterns will be run through the cone of logic in the functional path to each flip-flop. The serial scan chains are observed on the integrated circuit outputs, and if a serial pattern matches the expected result, then the IC is deemed good. A typical test sequence in a scan pattern consists of a scan-in operation, a set of input stimulus, and a scan-out operation. Desired values are loaded into the scan flip-flops. During the implementation of a scan, a circuit design is tested as one entity, and the design flip-flops are interconnected into a single, long shift register, or in other words a scan chain. Values are loaded and/or extracted from the scan flip-flops by serially shifting in and out one bit per clock cycle.

FIG. 1 discloses a block diagram illustrating a prior art functional block arrangement. This arrangement illustrates a typical high-level integration design in which there are a number of major functional blocks, in this case block A, block B and block C. In this arrangement, the functional mode, blocks B and C both depend on block A to function.

In integrated circuit 10, the output of block A goes to the input of block B via line 12A and conversely the output from block B goes to the input of block A via line 12B. Similarly, the output of block A goes to block C via line 14A and the output of block C goes to block A via line 14B. In each case, each of the functional blocks A, B and C send and receive data via their respective bus line 16A, 16B and 16C. In this arrangement, blocks B and C both depend on block A to function. However, blocks B and C do not depend on each other to function. Therefore, in such an arrangement, if a failure is detected during testing of block A, the entire integrated circuit 10 must be scrapped because there is no ability to salvage the functionality of the remaining blocks. This is due to the fact that block A affects both block B and block C. The inability to prevent information coming out of block A (which is unreliable) from affecting the logic of blocks B and C makes any properly functioning blocks also unreliable. An example illustrating this concept would be an integrated circuit design where block A is a bus interface to a microprocessor, block B is a fire wire interface, and block C is a USB interface. In short, there is no way in the conventional design to bypass a failed functional block from corrupting valid functional block logic.

The problem with this technique in current applications is that if there is a failure in one section of the integrated circuit (IC) the failing section cannot be prevented from affecting the logic in the rest of the IC. Consequently, it is not possible to prove that the rest of the IC is good silicon, and therefore producing valid logic. There currently are techniques that use partial scan testing of individual functional blocks, but these techniques do not adequately test the interaction between the functional blocks, because the failure of one block will corrupt the logic of any associated blocks. Therefore, the testing of functional blocks individually is not useful since they cannot be tested in logical isolation. It is desired to provide a way to isolate an entire functional block from the rest of the integrated circuit and partially test the integrated circuit even when portions of the IC have failed.

SUMMARY OF THE INVENTION

The present invention solves the above-identified problems and allows any number of functional blocks within the IC to be isolated, and therefore logically removed from scan testing, allowing the rest of the IC to be tested normally. By isolating a failing block and continuing testing, the entire IC does not have to be scrapped. It could be packaged and sold at a reduced cost without the failing functionality. This would then increase the yield of the IC batch, and lower the costs of producing the IC. For example, if a system on a chip IC were to fail during full scan testing, and the failure was isolated down to a single functional block, for example an interface, the chip could be packaged and resold into markets that do not require the particular interface.

In accordance with one aspect of the invention, the method of partial scan testing an integrated circuit is disclosed. The method includes initially scan testing an integrated circuit, and then determining from the scan testing at least one failed functional block in a group of non-failing functional blocks. The method includes logically isolating an output of the at least one failed functional block from the group of non-failing functional blocks. After the isolating, the method includes scan testing the group of non-failing functional blocks of the integrated circuit.

In another aspect of the invention, a method of testing an integrated circuit includes the steps of identifying at least one failed logic section of the integrated circuit during scan testing. The failed logic section is then logically isolated from a remainder of the integrated circuit. The method includes testing the integrated circuit without utilizing the failed logic section to permit operation of the integrated circuit at a reduced functionality.

In yet another aspect of the invention, an integrated circuit is disclosed and includes at least one functional block that has failed a scan test and at least one non-failing functional block logically connected to the failing functional block. The invention includes logical circuitry connected to the at least one failed functional block and the at least one non-failing functional block to isolate the failing functional block from the non-failing functional block during testing and operation of the integrated circuit.

Accordingly, it is the object of the present invention to allow the testing and operation of an integrated circuit at a reduced functionality by isolating failed functional sections from non-failing functional sections.

BRIEF DESCRIPTION OF THE DRAWINGS

The drawings illustrate the best mode presently contemplated for carrying out the invention.

In the drawings.

DETAILED DESCRIPTION OF THE PREFERRED EMBODIMENT

Figure 2:
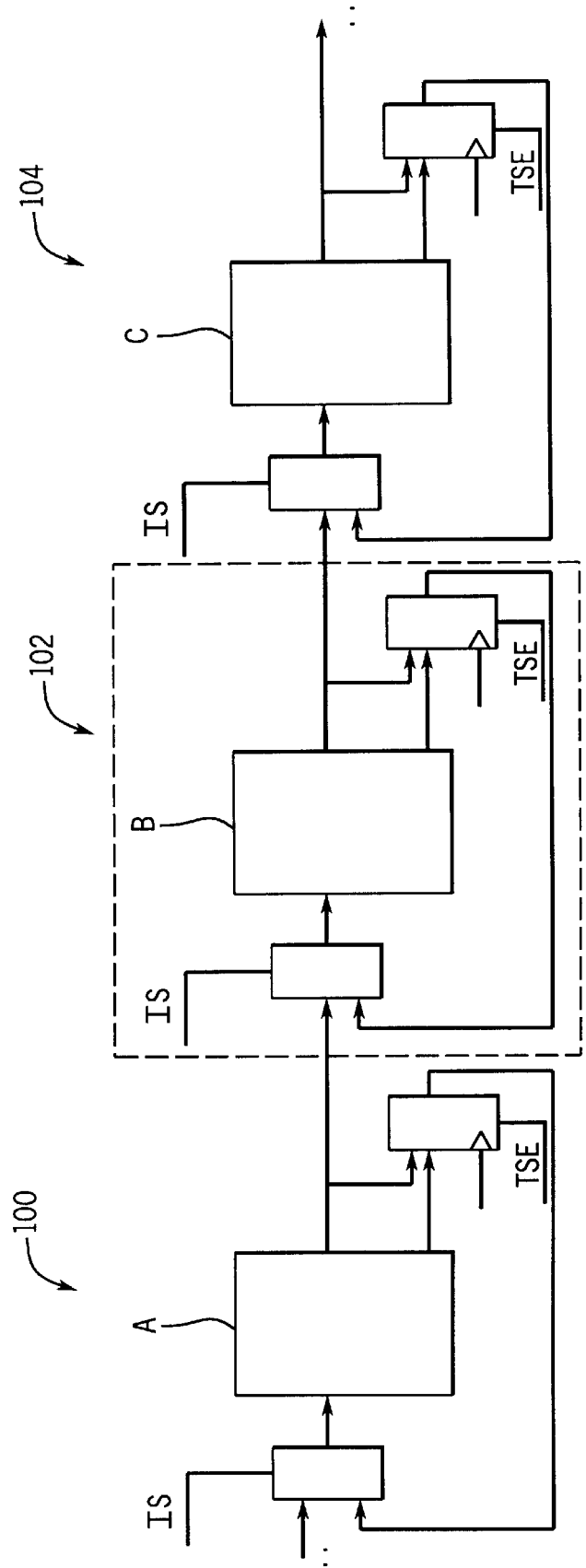
FIG. 2 is a schematic illustrating the integrated circuit in accordance with the present invention.

Referring to FIG. 2, an example of a series of functional blocks in accordance with the present invention is illustrated. Although three sections identified generally by sections 100, 102 and 104 are shown, such sections will be repeated along the integrated circuit and would be repeated in a chain or array. The number of sections is limited only by the number of functionalities in the integrated circuit. Each section 100, 102 and 104 includes a functional block A, B and C, respectively. Each functional block A, B and C is a section of logic that performs a function that is able to be partitioned from the remainder of the integrated circuit. Functional blocks A, B and C may in themselves be complex circuits that together form a single function.

Figure 1:
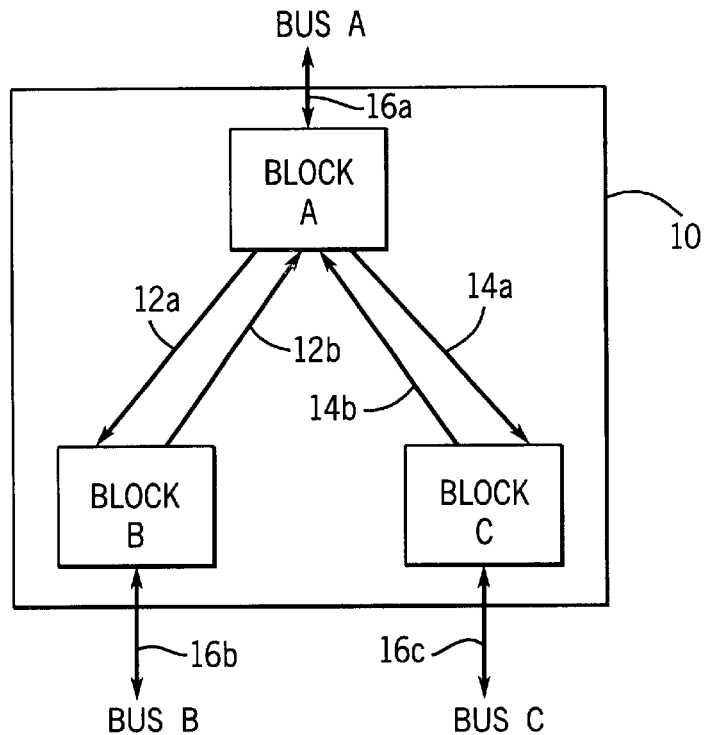
FIG. 1 is a block diagram of a prior art functional block arrangement.
Figure 3:
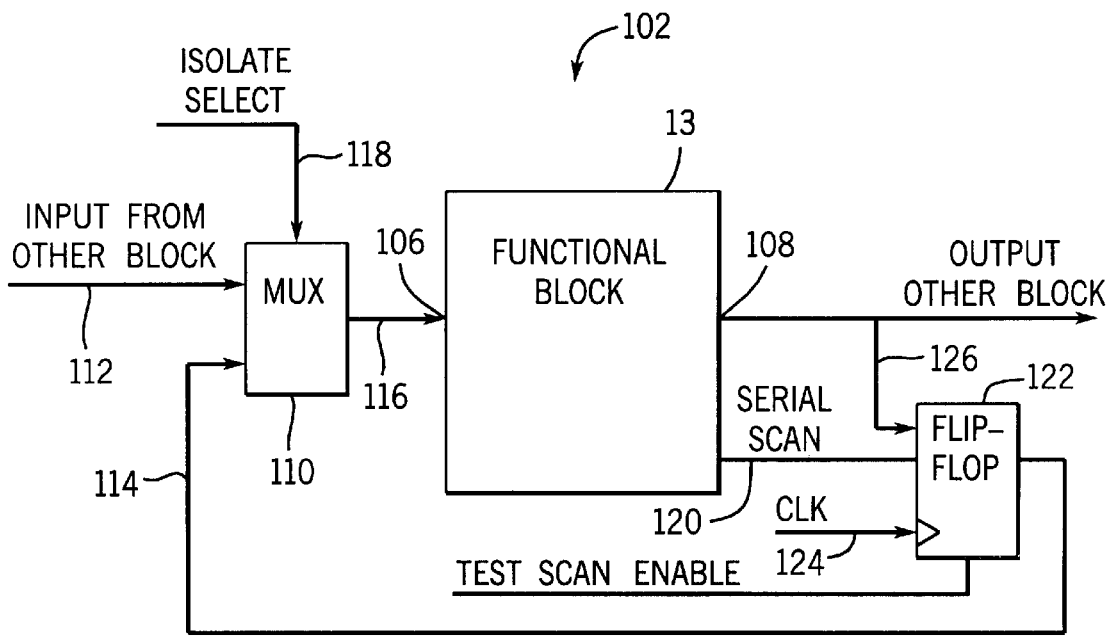
FIG. 3 shows a portion of the integrated circuit of FIG. 2.

Referring to FIG. 3, section 102 of FIG. 2 is shown. It is to be understood that the functions, electrical connections and relationships between the functional block and the testing logic are the same for sections 100 and 104, as will be explained with respect to section 102.

Functional block B includes input 106 and output 108, multiplexer 110 or other selected connector. Multiplexer 110, in this case a two-to-one multiplexer, has a functional input 112 which is tied in from the previous functional block (functional block A of FIG. 2) and isolating input 114 and multiplexer output 116, which is connected to the input 106 of functional block B. Multiplexer 110 also includes an isolating select input 118 which is used to select between functional input 112 and isolating input 114.

As is known in the art, scan testing is often used to determine the correct functioning of a functional block of logic within an integrated circuit. To that end, functional block B includes a serial scan line output 120. During normal scan mode, data is shifted in and out of testing flip-flop 122 in a serial fashion. The serial data shifted into functional block B input 106 is observed coming out of serial scan output line 120 and into flip-flop 122. Flip-flop 122 may be any type of register, and includes clock signal 124 and data input 126 from the functional block B. Serial scan line 120 is a path for serial data during test mode, but flip-flop 122 does not contribute to the overall functionability outside the testing of the chip.

In operation, during scan testing of functional blocks A, B and C, if it was determined that functional block A was producing invalid data, it would be necessary to isolate the data stream from entering functional block B. Therefore, isolation select line 118 would be enabled in order to select line 114 entering multiplexer 110, rather than functional input 112 from functional block A in this case. Isolated input 114 represents output from the test flip-flop 122 which stores output 108 from functional block B. In essence, the output from the functional block B is rerouted as its own input, thereby isolating functional block A from the reminder of the logic circuit. Because the output from invalid functional block A 112 is not selected, it is not an issue to determine the status of that data line, since it is not selected by multiplexer 110. It is known, however, that functional block B has an output that is valid during testing and therefore that output is rerouted via isolating input 114 in order to isolate functional block A.

In a similar manner, if during scan testing it was determined that functional block B's output was invalid, functional block output 108 would not be selected to enter the next multiplexer associated with the next functional block (for example, functional block C of FIG. 2). In this manner, each functional block is capable of isolating the previous functional block output from the remainder of the integrated circuit to enable scan testing of the valid functional blocks in the integrated circuit.

Figure 4:
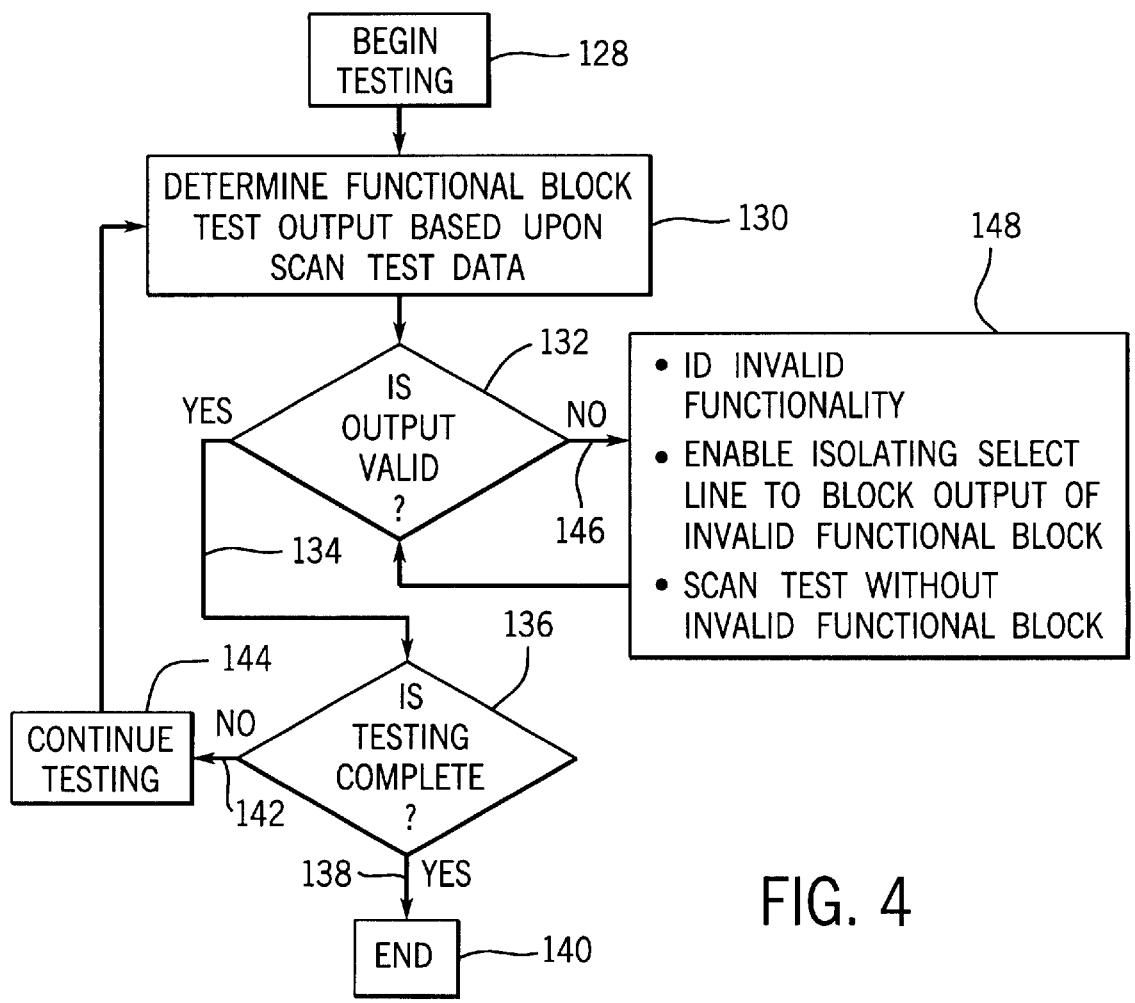
FIG. 4 is a flowchart illustrating the method in accordance with one aspect of the present invention.

Referring to FIG. 4, a flowchart illustrated the methodology associated with the present invention. In block 128, testing commences of the integrated circuit. It is preferred in the present invention to use scan testing as the testing method. This testing is of all functional blocks in the integrated circuit. During this full testing, it is determined as shown by block 130 what the functional block test output is of each functional block based upon the input scan test data. In the beginning of testing, this will entail determining the validity of each functional block, whereas later in the procedure it is only necessary to determine the test output of valid functional blocks. A determination is made at 132 whether the output of the functional blocks of interest are valid. This is determined in a known manner based upon comparison of the scanned in serial data and the output of each of the functional blocks as shifted through their respective flip-flops via their serial scan chains. If the output is valid 134, a determination is made at 136 whether testing is complete. If yes, 138 testing is completed and the procedure is ended 140. If not, 142 testing continues as shown in block 144 and again functional block test outputs are determined. If that decision 132 output of any functional block is not valid, at block 148 that invalid functional block is identified. As a result of the identification of an invalid functional block, the isolating select line is enabled for the multiplexer receiving the output of that invalid functional block. This in effect blocks the output of the invalid functional block from corrupting the logic of the remaining functional blocks. The scan test then continues without the invalid functional block data entering any further functional blocks. A partial scan test is created because the output from the invalid functional blocks is not utilized. The partial scan test continues in a typical fashion to determine whether the remainder functional blocks are outputting valid data based upon the test input data at 132. This procedure continues until all of the output data is valid, testing is complete and the invalid functional blocks are identified. The now-tested IC may be used at a reduced functionality without the invalid functional blocks that failed scan testing.

In such a manner, it can then be determined whether the integrated circuit can be sold without the functioning of the invalid functional blocks. The reduced functionality integrated circuit can then be utilized where it would normally have been scrapped. However, in this instance, the invalid functional blocks had been identified and separated out from the remainder of the integrated circuit.

The present invention has been described in terms of the preferred embodiment, and it is recognized that equivalents, alternatives, and modifications, aside from those expressly stated, are possible and within the scope of the appending claims.

I claim:

1. An integrated circuit comprising:
   a logic circuit having a plurality of functional blocks each having a functional block input and a functional block output;
   a multiplexer logically connected between a pair of the plurality of functional blocks, each multiplexer having an isolating input, an isolating select input, an output connected to one of the plurality of functional blocks and an input connected to another of the plurality of functional blocks;
   a register having a register input connected to one of the functional block outputs and a register output connected to the isolated input of the multiplexer;
   wherein each of the functional blocks is capable of being logically isolated from the logic circuit; and
   wherein when at least one of the plurality of functional blocks is determined to be an invalid functional block during testing of the logic circuit, the invalid functional block is identified and logically isolated from the other functional blocks, such that the tested logic circuit is a reduced functionality logic circuit that can be operated at a reduced functionality by bypassing the invalid functional block during operation of the logic circuit.

2. An integrated circuit for partial scan testing comprising;
   a plurality of functional blocks;
   a testing multiplexer having an output electrically connected to each of the functional blocks and an input electrically connected to another of the functional blocks;
   a testing flip-flop having an input electrically connected to each of the functional blocks and an output electrically connected to an isolating input of the multiplexer;
   wherein the multiplexer includes an isolation select line that causes the multiplexer to select the isolating input connected to the output of the flip-flop and does not select the input from any of the other functional blocks when enabled; and
   wherein when at least one of the plurality of functional blocks is determined to be an invalid functional block during testing of the integrated circuit, the invalid functional block is identified and logically isolated from the other functional blocks with the multiplexor, such that the tested integrated circuit is a reduced functionality integrated circuit that can be operated at a reduced functionality by bypassing the invalid functional block during operational of the integrated circuit.

* * * * *

UNITED STATES PATENT AND TRADEMARK OFFICE
CERTIFICATE OF CORRECTION

PATENT NO. : 6,515,483 B1
DATED : February 4, 2003
INVENTOR(S) : A. Kent Porterfield It is certified that error appears in the above-identified patent and that said Letters Patent is hereby corrected as shown below:

<u>Column 4,</u>
Line 37, replace "illustrated" with -- illustrates --.

<u>Column 6,</u>
Line 34, replace "operational" with -- operation --.

Signed and Sealed this

Sixth Day of May, 2003

JAMES E. ROGAN
*Director of the United States Patent and Trademark Office*